United States Patent
Furuta

(10) Patent No.: US 9,018,080 B2
(45) Date of Patent: Apr. 28, 2015

(54) WAFER PROCESSING METHOD

(71) Applicant: Disco Corporation, Tokyo (JP)

(72) Inventor: Kenji Furuta, Tokyo (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 14/041,051

(22) Filed: Sep. 30, 2013

(65) Prior Publication Data

US 2014/0094019 A1     Apr. 3, 2014

(30) Foreign Application Priority Data

Oct. 1, 2012    (JP) .................................. 2012-219098

(51) Int. Cl.
*H01L 21/78*     (2006.01)

(52) U.S. Cl.
CPC ....................................... *H01L 21/78* (2013.01)

(58) Field of Classification Search
CPC ........................................................ H01L 21/78
USPC .......... 438/795, 785, 463, 438; 257/428, 659, 257/E47.003
See application file for complete search history.

(56) References Cited

U.S. PATENT DOCUMENTS

| 2009/0203193 A1* | 8/2009 | Morikazu et al. ............. 438/463 |
| 2011/0056922 A1* | 3/2011 | Ueki ........................ 219/121.72 |
| 2011/0195536 A1* | 8/2011 | Koyanagi et al. ............... 438/33 |

FOREIGN PATENT DOCUMENTS

JP     2002-192370     7/2002

* cited by examiner

*Primary Examiner* — Fernando L Toledo
*Assistant Examiner* — Adam S Bowen
(74) *Attorney, Agent, or Firm* — Greer Burns & Crain Ltd.

(57) ABSTRACT

A wafer processing method of dividing a wafer along a plurality of crossing streets formed on the wafer to obtain individual chips. The wafer processing method includes a modified layer forming step of applying a laser beam having a transmission wavelength to the wafer along each street to thereby form a modified layer inside the wafer and a dividing step of applying an external force to the wafer to thereby divide the wafer into the individual chips along each street with the modified layer functioning as a division start point. In the modified layer forming step, the modified layer is formed at each intersection of the crossing streets at a height where cracking can be avoided on the corner edges of each chip obtained by dividing the wafer.

3 Claims, 6 Drawing Sheets

WAFER PROCESSING METHOD

BACKGROUND OF THE INVENTION

1. Field of the Invention

The present invention relates to a wafer processing method of dividing a wafer such as a semiconductor wafer and an optical device wafer into a plurality of individual chips.

2. Description of the Related Art

As a wafer processing method of dividing a wafer into a plurality of individual chips, attention has conventionally been focused on a technique of dividing the wafer by laser processing. As an example of this laser processing, there has been proposed a processing method of applying a laser beam having a transmission wavelength to the wafer to thereby form a weak layer (modified layer) inside the wafer, wherein the modified layer reduced in strength functions as a division start point (see Japanese Patent No. 3408805, for example). In the processing method described in Japanese Patent No. 3408805, the laser beam is applied along a plurality of crossing streets formed on the front side of the wafer to linearly form the modified layer inside the wafer along each street. By applying an external force to the weak modified layer formed inside the wafer along each street, the wafer is divided along each modified layer to obtain the individual chips.

SUMMARY OF THE INVENTION

The laser processing method described in Japanese Patent No. 3408805 has a merit such that unlike mechanical dicing using a dicing saw or the like no cutting waste is produced and the width of cut is very small, which contributes to a reduction in width of each street. However, due to the effect of the modified layer formed at each intersection of the crossing streets, there is a problem such that cracking or chipping easily starts to occur at the forming position of the weak modified layer on the corner edges of each chip obtained by dividing the wafer.

It is therefore an object of the present invention to provide a wafer processing method which can well divide the wafer without the occurrence of cracking or chipping in each chip obtained by dividing the wafer.

In accordance with an aspect of the present invention, there is provided a wafer processing method of processing a wafer having a plurality of first streets and a plurality of second streets formed on a front side of the wafer, the first streets extending in a predetermined direction and intersecting the second streets to partition a plurality of regions where a plurality of devices are respectively formed, the wafer processing method including an expand tape attaching step of attaching an expand tape to the front side of the wafer; a first modified layer forming step of setting the focal point of a laser beam having a transmission wavelength to the wafer at a first height from the front side of the wafer after performing the expand tape attaching step and applying the laser beam from a back side of the wafer along the first streets and the second streets to thereby form first modified layers inside the wafer at the first height; a second modified layer forming step of setting the focal point of the laser beam at a second height different from the first height from the front side of the wafer before or after performing the first modified layer forming step and applying the laser beam from the back side of the wafer to only each intersection of the first streets and the second streets to thereby form second modified layers at the second height of each intersection; and a dividing step of applying an external force to the wafer after performing the first and second modified layer forming steps to thereby divide the wafer into individual device chips along the first streets and the second streets with the first and second modified layers functioning as division start points; the second height being set at any position other than the positions corresponding to corner edge positions where cracks start to be generated on the corner edges of each device chip obtained by performing the dividing step.

Preferably, the first modified layer forming step includes the step of stopping the application of the laser beam at each intersection of the first streets and the second streets in applying the laser beam along either the first streets or the second streets or along both the first streets and the second streets.

In accordance with another aspect of the present invention, there is provided a wafer processing method of processing a wafer having a plurality of first streets and a plurality of second streets formed on a front side of the wafer, the first streets extending in a predetermined direction and intersecting the second streets to partition a plurality of regions where a plurality of devices are respectively formed, the wafer processing method including an expand tape attaching step of attaching an expand tape to the front side of the wafer; a first modified layer forming step of setting the focal point of a laser beam having a transmission wavelength to the wafer at a first height from the front side of the wafer after performing the expand tape attaching step and applying the laser beam from a back side of the wafer along the first streets and the second streets to thereby continuously form first modified layers inside the wafer at the first height; a second modified layer forming step of setting the focal point of the laser beam at a second height different from the first height from the front side of the wafer before or after performing the first modified layer forming step and applying the laser beam from the back side of the wafer along the first streets and the second streets to thereby form second modified layers at the second height inside the wafer; and a dividing step of applying an external force to the wafer after performing the first and second modified layer forming steps to thereby divide the wafer into individual device chips along the first streets and the second streets with the first and second modified layers functioning as division start points; the second height corresponding to corner edge positions where cracks start to be generated on the corner edges of each device chip obtained by performing the dividing step; the second modified layer forming step including the step of stopping the application of the laser beam at each intersection of the first streets and the second streets in applying the laser beam along either the first streets or the second streets or along both the first streets and the second streets.

With this configuration, the second modified layer is formed at each intersection of the first and second streets at the position (height) where the cracks do not easily start to be generated on the corner edges of each device chip obtained by dividing the wafer. Accordingly, when the wafer is divided into individual device chips along the first and second streets, cracking or chipping does not easily start to occur on the corner edges of each device chip. Further, a plurality of first modified layers are preferably formed at different heights along the first and second streets, and one or more second modified layers are preferably formed at different heights at each intersection, wherein the number of these different heights is less than the number of heights of the first modified layers. Accordingly, even when the application of the laser beam is stopped at each intersection or the focal point of the laser beam is changed at each intersection, at least one second modified layer is always formed at each intersection, so that the wafer can be well divided along the first and second streets to obtain the individual device chips.

The above and other objects, features and advantages of the present invention and the manner of realizing them will become more apparent, and the invention itself will best be understood from a study of the following description and appended claims with reference to the attached drawings showing some preferred embodiment of the invention.

DETAILED DESCRIPTION OF THE PREFERRED EMBODIMENT

A wafer processing method according to a preferred embodiment of the present invention will now be described. The wafer processing method according to this preferred embodiment includes an expand tape attaching step by a tape attaching apparatus, a modified layer forming step by a laser processing apparatus, and a dividing step by a tape expanding apparatus. In the expand tape attaching step, an expand tape is attached to the front side of a wafer. In the modified layer forming step, a plurality of first modified layers having different heights are formed inside the wafer along each street. In this modified layer forming step, a second modified layer is formed at each intersection of the crossing streets at any height other than the heights which may become the positions (start points) of generation of cracks.

In the dividing step, an external force is applied to the wafer to thereby divide the wafer along the first streets and the second streets intersecting each other with the first and second modified layers functioning as break start points, thus obtaining individual device chips. In this dividing step, the corner edges of each device chip obtained by the dividing step are less prone to cracking or chipping because the first and second modified layers are formed at the positions other than the positions of generation of cracks in the modified layer forming step. Further, at least one modified layer (second modified layer) is formed at each intersection of the first and second streets, so that the wafer can be well divided along the first and second streets. The wafer processing method according to this preferred embodiment will now be described in more detail with reference to the attached drawings.

Figure 1:
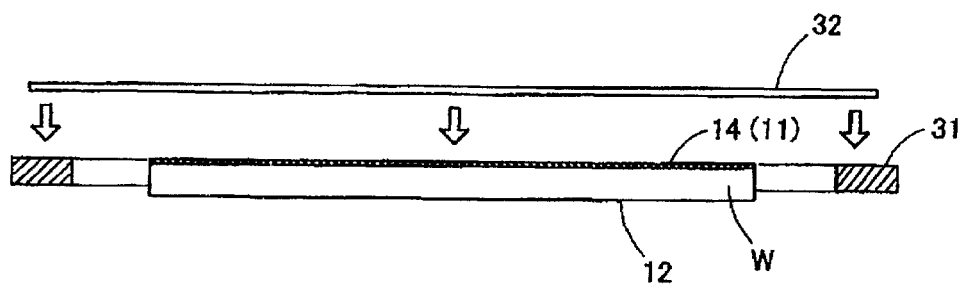
FIG. 1 is a partially sectional side view showing an expand tape attaching step.
Figure 2:
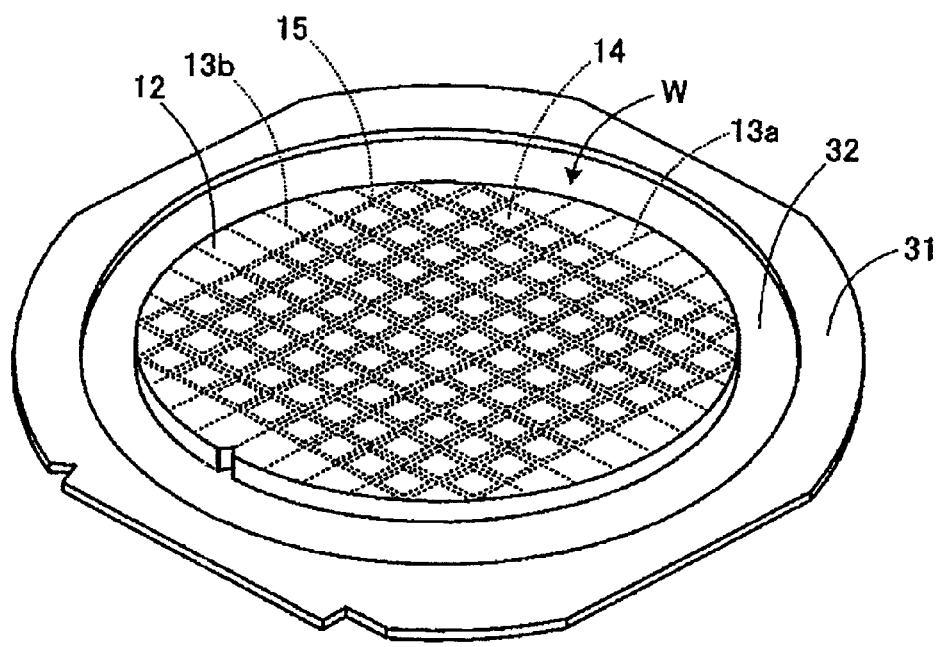
FIG. 2 is a perspective view of a wafer supported through an expand tape to a ring frame as viewed from the back side of the wafer.

The expand tape attaching step will now be described with reference to FIGS. 1 and 2. As shown in FIGS. 1 and 2, an expand tape 32 preliminarily attached to a ring frame 31 is attached to the front side 11 of a substantially disk-shaped wafer W in the expand tape attaching step. By this attachment of the expand tape 32 to the wafer W, the back side 12 of the wafer W as an irradiated surface to be irradiated with a laser beam in the next modified layer forming step is exposed and the front side 11 of the wafer W as a held surface to be held in the next modified layer forming step is protected by the expand tape 32. After performing this expand tape attaching step, the wafer W to which the expand tape 32 is attached is carried to a laser processing apparatus (not shown). The expand tape 32 may be any expansible tape. For example, the expand tape 32 is formed by applying an adhesive to one side of a base sheet of polyvinyl chloride.

On the front side 11 of the wafer W, which side is covered with the expand tape 32, there are formed a plurality of first streets 13a extending in a predetermined direction and a plurality of second streets 13b intersecting the first streets 13a. Accordingly, a plurality of regions are partitioned by the first and second streets 13a and 13b, and a plurality of devices 14 are respectively formed in the plural regions. The wafer W may be a semiconductor wafer constituted of a semiconductor substrate of silicon, gallium arsenide, etc. and devices such as ICs and LSIs formed on the semiconductor substrate or may be an optical device wafer constituted of an inorganic material substrate of ceramic, glass, sapphire, etc. and optical devices such as LEDs formed on the inorganic material substrate.

Figures 3A, 3B:
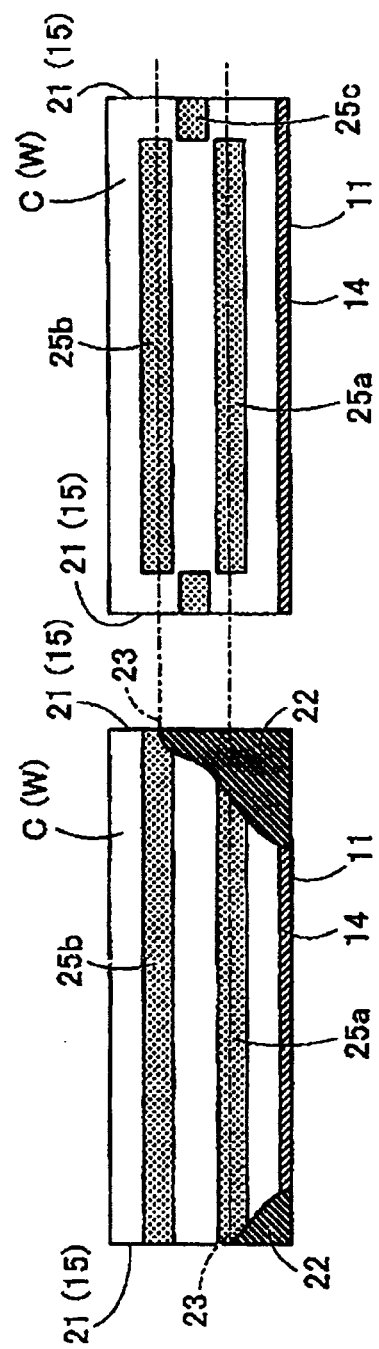
FIG. 3A is a schematic sectional view of a chip as a comparison.
FIG. 3B is a schematic sectional view of a chip according to a preferred embodiment of the present invention.

Referring to FIG. 3A, there is shown a schematic sectional view of a chip C as a comparison formed by a conventional processing method. On the other hand, FIG. 3B shows a schematic sectional view of a chip C formed by this preferred embodiment of the present invention. In the chip C shown in FIG. 3A and the chip C shown in FIG. 3B, the same parts are denoted by the same reference symbols.

Prior to description of the modified layer forming step, the positions of generation of cracks in the chip obtained by dividing the wafer will now be described. The chip C as a comparison shown in FIG. 3A is obtained by continuously forming modified layers 25a and 25b at different heights along each of the first and second streets 13a and 13b (see FIG. 2) of the wafer W and next dividing the wafer W along each street with the modified layers 25a and 25b functioning as break start points. Although the heights of the modified layers 25a and 25b are suitable for the division of the wafer W, these heights are heights where cracks 22 are easily generated at each corner edge 21 of the chip C. For example, in the chip C as a comparison shown in FIG. 3A, the cracks 22 are generated from the corner edges 21 at different heights where the modified layers 25a and 25b are formed to the front side 11. In this manner, at the corner edges 21 of the chip C, the cracks 22 or chipping are easily generated from the positions (heights) where the strength is reduced by the modified layers 25.

In the chip C shown in FIG. 3A, the cracks 22 are generated from the corner edges 21 at the heights of the modified layers 25a and 25b. To the contrary, in the chip C according to this preferred embodiment shown in FIG. 3B, it was confirmed by the present applicant that the cracks 22 are not generated from the corner edges 21 at the height of a modified layer 25c. That is, when the modified layers 25a and 25b are formed at the specific heights on the corner edges 21, the heights of the modified layers 25a and 25b become corner edge positions 23 where the cracks 22 starts to be generated, whereas when the modified layer 25c is formed at the height different from the above specific heights on the corner edges 21, the height of the modified layer 25c does not become the corner edge position 23. In this preferred embodiment, at each intersection 15 of the first and second streets 13a and 13b of the wafer W corresponding to each corner edge 21 of the chip C obtained by dividing the wafer W, the modified layer 25c is formed at the height different from the heights corresponding to the corner edge positions 23.

More specifically, in the chip C according to this preferred embodiment, the modified layers 25a and 25b are formed at the heights suitable for division of the wafer W in an area except the corner edges 21, and the modified layer 25c is formed at the height different from the heights corresponding to the corner edge positions 23 on the corner edges 21. With this configuration, the wafer W is easily divided in the area except the corner edges 21 and the cracks 21 or chipping are not easily generated on the corner edges 21. The corner edge positions 23 as the start positions of generation of the cracks 22 in the chip C obtained by dividing the wafer W vary in the direction of thickness of the chip C according to the material of the wafer W and the processing conditions for the wafer W. Accordingly, it is preferable to check the condition of the chip C in a test processing step prior to starting the production and then adjust the focal point of a laser beam to the height different from the crack generation heights (the corner edge positions 23) on the corner edges 21.

Each modified layer 25 (representing the modified layers 25a, 25b, and 25c) is an area where the density, refractive index, mechanical strength, and other physical properties become different from those of its ambient area in the wafer W by the application of a laser beam, causing a reduction in strength as compared with the ambient area. Examples of each modified layer 25 include a melted and rehardened area, crack area, dielectric breakdown area, refractive index changed area, and their mixed area.

Figure 4A:
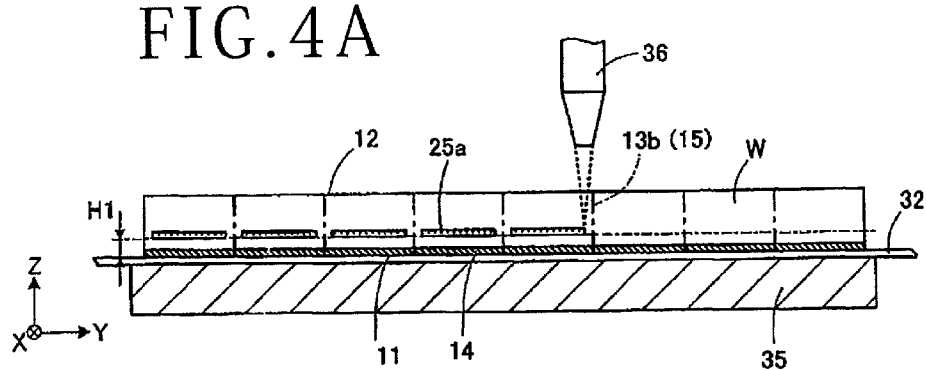
FIGS. 4A to 4C are sectional views showing a modified layer forming step according to this preferred embodiment.

The modified layer forming step according to this preferred embodiment will now be described with reference to FIGS. 4A to 4C. This modified layer forming step is performed after performing the expand tape attaching step mentioned above. As shown in FIG. 4A, the wafer W is held through the expand tape 32 on a chuck table 35 constituting the laser processing apparatus (not shown). The beam outlet of a processing head 36 constituting the laser processing apparatus is positioned directly above a predetermined one of the first streets 13a (see FIG. 2) of the wafer W, and a laser beam is applied from the beam outlet of the processing head 36 toward the back side 12 (upper surface) of the wafer W. The laser beam has a transmission wavelength to the wafer W, and the focal point of the laser beam is adjusted to a first height H1 inside the wafer W.

The processing head 36 is relatively moved in the Y direction with respect to the wafer W, thereby forming the modified layer 25a along this predetermined first street 13a at the first height H1 inside the wafer W. This first height H1 is a position where cracking or chipping easily starts to occur on the corner edges 21 of the chip C obtained by dividing the wafer W (see FIG. 3A). To cope with this problem, laser processing is performed at the first height H1 except each intersection 15 of this predetermined first street 13a and the second streets 13b. That is, the application of the laser beam to the wafer W is stopped at each intersection 15, so that the modified layer 25a is discontinuously formed along this predetermined first street 13a at the first height H1 inside the wafer W. This laser processing is similarly performed along all of the other first streets 13a and all of the second streets 13b except each intersection 15.

Figure 4B:
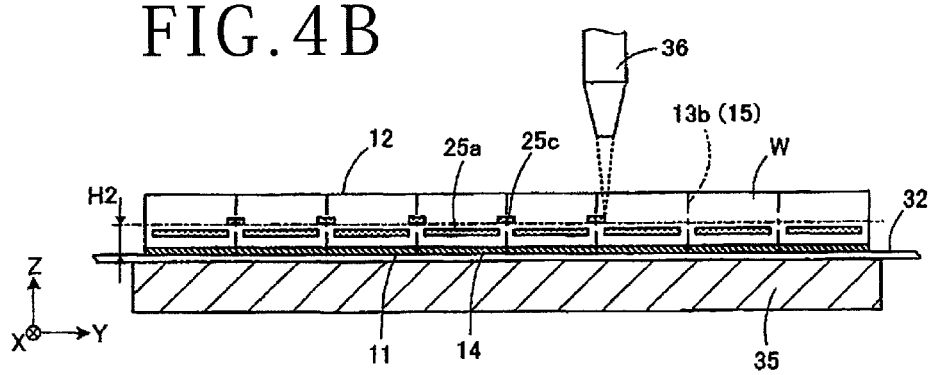

After forming the modified layers 25a along all of the first and second streets 13a and 13b at the first height H1 as mentioned above, the focal point of the laser beam is shifted upward to be adjusted to a second height H2 as shown in FIG. 4B. This second height H2 is a position where cracking or chipping does not easily start to occur on the corner edges 21 of the chip C obtained by dividing the wafer W (see FIG. 3B). In this condition where the focal point of the laser beam is set at the second height H2, the processing head 36 is relatively moved in the Y direction with respect to the wafer W, thereby forming the modified layer 25c at each intersection 15 of the first streets 13a and the second streets 13b at the second height H2, wherein the modified layer 25a is not formed at each intersection 15 as mentioned above. The modified layer 25c is formed at each intersection 15 so as to slightly extend along either the first streets 13a or the second streets 13b or along both the first streets 13a and the second streets 13b.

Figure 4C:
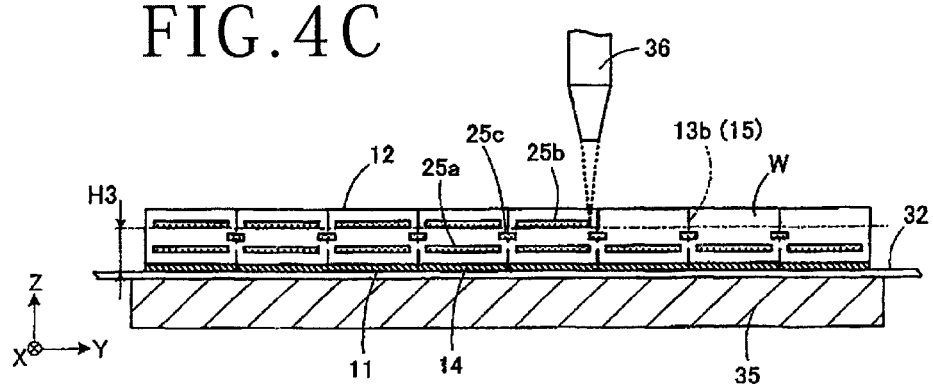

After forming the modified layers 25c at all of the intersections 15 of the first streets 13a and the second streets 13b at the second height H2 as mentioned above, the focal point of the laser beam is shifted upward to be adjusted to a third height H3 as shown in FIG. 4C. This third height H3 is a position where cracking or chipping easily starts to occur on the corner edges 21 of the chip C obtained by dividing the wafer W (see FIG. 3A). To cope with this problem, laser processing is performed at the third height H3 except each intersection 15 of the predetermined first street 13a and the second streets 13b. That is, the application of the laser beam to the wafer W is stopped at each intersection 15, so that the modified layer 25b is discontinuously formed along the predetermined first street 13a at the third height H3 inside the wafer W. This laser processing is similarly performed along all of the other first streets 13a and all of the second streets 13b except each intersection 15.

In this manner, the modified layers 25a and 25b are respectively formed at the first and third heights H1 and H3 inside the wafer W except each intersection 15 of the first and second streets 13a and 13b. Further, the modified layer 25c is formed at the second height H2 at each intersection 15 of the first and second streets 13a and 13b, wherein the cracks 22 do not easily start to be generated at the second height H2 in the form of the chip C. Thus, the modified layer 25c is formed at each intersection 15 in addition to the modified layers 25a and 25b along the first and second streets 13a and 13b. Accordingly, the wafer W can be well divided along the first and second streets 13a and 13b. Furthermore, since the modified layer 25c is formed at each intersection 15 at the height where the cracks 22 do not easily start to be generated, it is possible to prevent the occurrence of cracking or chipping at the corner edges 21 of the chip C obtained by dividing the wafer W.

While the second height H2 is set between the first height H1 and the third height H3 in the direction of thickness of the wafer W in this preferred embodiment, the present invention is not limited to this configuration. That is, it is essential that the second height H2 is to be set to any position where cracking or chipping does not easily start to occur at each intersection 15 of the first and second streets 13a and 13b. For example, the second height H2 may be set to a position lower than the first height H1 or may be set to a position higher than the third height H3.

Further, the order of formation of the modified layers 25 (25a, 25b, and 25c) is not especially limited provided that the modified layers 25 are formed along the first and second streets 13a and 13b inside the wafer W. For example, after forming the modified layer 25c at the second height H2 at each intersection 15 of the first and second streets 13a and 13b, the modified layers 25a and 25b may be formed at the first and third heights H1 and H3 along the first and second streets 13a and 13b except each intersection 15.

Figure 5A:
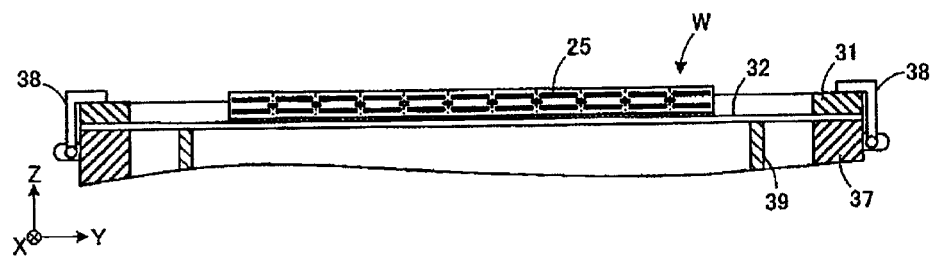
FIGS. 5A and 5B are sectional views showing a dividing step according to this preferred embodiment.

The dividing step according to this preferred embodiment will now be described with reference to FIGS. 5A and 5B. This dividing step is performed after performing the modified layer forming step mentioned above. As shown in FIG. 5A, the ring frame 31 supporting the wafer W through the expand tape 32 is placed on an annular table 37 constituting the tape expanding apparatus (not shown) and held on the annular table 37 by clamps 38 included in the tape expanding apparatus. The annular table 37 is vertically movable. The tape expanding apparatus further includes an expansion drum 39. The outer diameter of the expansion drum 39 is smaller than the inner diameter of the ring frame 31, and the inner diameter of the expansion drum 39 is larger than the diameter of the wafer W. Accordingly, the upper end of the expansion drum 39 comes into abutment against the expand tape 32 in its area between the wafer W and the ring frame 31.

Figure 5B:
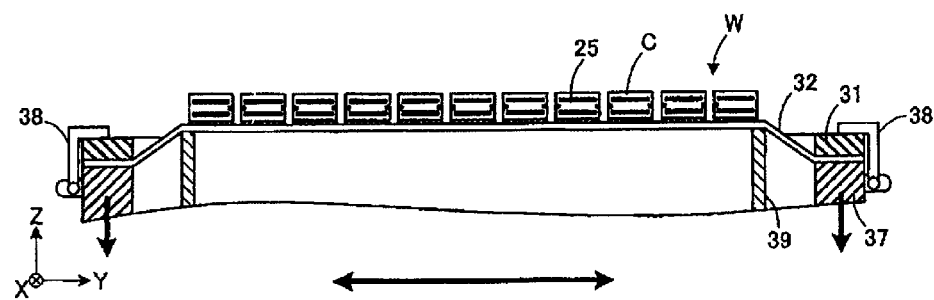

As shown in FIG. 5B, the annular table 37 is lowered to thereby lower the ring frame 31. As a result, the expansion drum 39 is relatively raised with respect to the annular table 37. Accordingly, the expand tape 32 is radially expanded to apply an external force through the expand tape 32 to the modified layers 25 formed inside the wafer W. As a result, the wafer W is divided along the first and second streets 13a and 13b (see FIG. 2) to obtain the individual chips C (devices 14). At this time, the modified layers 25 as weak areas function as division start points. After dividing the wafer W into the individual chips C, the spacing between any adjacent ones of the chips C is increased by the expansion of the expand tape 32. Thereafter, each chip C is picked up under suction by a pickup collet (not shown) and peeled from the expand tape 32. While the wafer W is divided by the expansion of the expand tape 32 in this preferred embodiment, the present invention is not limited to this configuration. That is, it is essential that the wafer can be divided along the modified layers corresponding to the first and second streets in the dividing step according to the present invention. For example, the wafer may be broken along the first and second streets by using a push blade.

According to the wafer processing method described above, the modified layer 25c is formed at each intersection 15 of the first and second streets 13a and 13b at the position (height) where the cracks 22 do not easily start to be generated on the corner edges 21 of the chip C obtained by dividing the wafer W. Accordingly, when the wafer W is divided along the first and second streets 13a and 13b, cracking or chipping does not easily start to occur on the corner edges 21 of the chip C. Further, the modified layer 25c is formed at each intersection 15 of the first and second streets 13a and 13b in addition to the modified layers 25a and 25b formed along the first and second streets 13a and 13b except each intersection 15. Accordingly, the wafer W can be well divided along the first and second streets 13a and 13b to obtain the individual chips C.

The present invention is not limited to the above preferred embodiment, but various modifications may be made. Further, the size and shape of each part shown in the attached drawings are merely illustrative and they may be suitably modified within the scope that can exhibit the effects of the present invention. In addition, the above preferred embodiment may be suitably modified without departing from the scope of the object of the present invention. For example, while the height of the modified layer is changed at each intersection 15 of the first and second streets 13a and 13b to thereby avoid the position where cracking or chipping easily starts to occur in the chip C obtained by dividing the wafer W in the above preferred embodiment, the present invention is not limited to this configuration. The application of the laser beam may be stopped at each intersection 15 of the first and second streets 13a and 13b to thereby avoid the position where cracking or chipping easily starts to occur in the chip C.

Figure 6A:
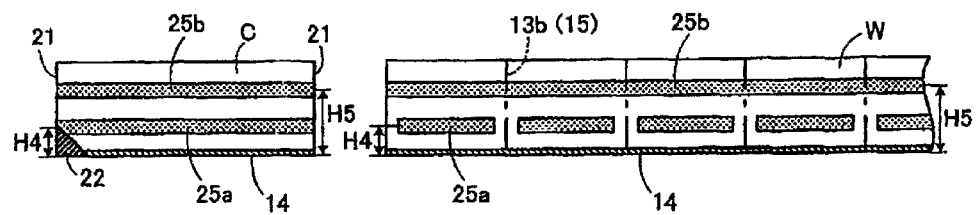
FIGS. 6A to 6C are sectional views showing modifications of the modified layer forming step according to this preferred embodiment.

Various modifications of the modified layer forming step according to the above preferred embodiment will now be described with reference to FIGS. 6A to 6C. In the following modifications, the same parts are denoted by the same reference symbols for convenience of illustration. In the case that the crack 22 or chipping easily starts to be generated at a fourth height H4 on the corner edges 21 of the chip C as shown in the left portion of FIG. 6A, the modified layer 25a may be discontinuously formed at the fourth height H4 as shown in the right portion of FIG. 6A. In this case, the focal point of the laser beam is set at the fourth height H4 and the laser beam is applied along the first and second streets 13a and 13b in such a manner that the application of the laser beam is intermittently stopped at each intersection 15 of the first and second streets 13a and 13b, thereby discontinuously forming the modified layer 25a at the fourth height H4 along the first and second streets 13a and 13b except each intersection 15. Thereafter, the focal point of the laser beam is set at a fifth height H5 to continuously form the modified layer 25b at the fifth height H5 along the first and second streets 13a and 13b.

With this configuration, the modified layer 25a can be formed so as to avoid the position where cracking or chipping easily starts to occur on the corner edges 21 of the chip C. Further, since the modified layer 25b is continuously formed at the fifth height H5, the wafer W can be well divided along the first and second streets 13a and 13b to obtain the individual chips C.

Figure 6B:
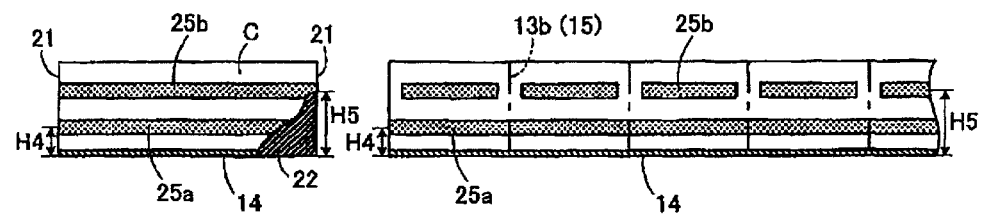

Conversely, in the case that the crack 22 or chipping easily starts to be generated at the fifth height H5 on the corner edges 21 of the chip C as shown in the left portion of FIG. 6B, the modified layer 25b may be discontinuously formed at the fifth height H5 as shown in the right portion of FIG. 6B. Also in this case, the wafer W can be well divided without the occurrence of cracking or chipping in the chip C as similar to the case shown in FIG. 6A. In discontinuously forming the modified layer 25a or 25b as shown in FIGS. 6A and 6B, the application of the laser beam may be stopped at each intersection 15 along either the first streets 13a or the second streets 13b or along both the first streets 13a and the second streets 13b.

While the modified layer 25c is formed at the second height H2 at each intersection 15 of the first and second streets 13a and 13b in the above preferred embodiment as shown in FIG. 4B, the present invention is not limited to this configuration. That is, a plurality of modified layers having different heights may be formed at each intersection 15, wherein the number of these different heights is not greater than the number of heights of the modified layers extending along the first and second streets 13a and 13b except each intersection 15. For example, in the case that the modified layers 25 are formed at two different heights along the first and second streets 13a and 13b except each intersection 15, other modified layers 25 may be formed at two different heights at each intersection 15.

Figure 6C:
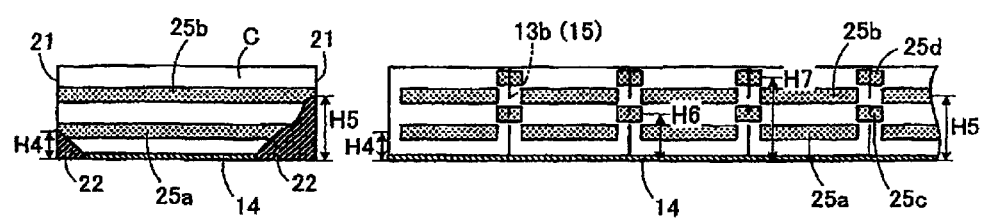

More specifically, in the case that the cracking or chipping easily starts to be generated at the fourth and fifth heights H4 and H5 on the corner edges 21 of the chip C as shown in the left portion of FIG. 6C, modified layers 25c and 25d may be formed at sixth and seventh heights H6 and H7 different from the fourth and fifth heights H4 and H5, respectively, at each intersection 15 as shown in the right portion of FIG. 6C. In this case, the focal point of the laser beam is set at the sixth and seventh heights H6 and H7 and the laser beam is applied to the wafer W at each intersection 15. Also in this case, the wafer W can be well divided without the occurrence of cracking or chipping in the chip C as similar to the case shown in FIG. 6A. In the modification shown in FIG. 6C, the laser beam may be applied to the wafer W at different heights at each intersection 15 so as to slightly extend along either the first streets 13a or the second streets 13b or along both the first streets 13a and the second streets 13b.

While the expand tape attaching step, the modified layer forming step, and the dividing step are performed by the separate apparatuses in the above preferred embodiment, a part or all of these steps may be performed by a single apparatus.

As described above, the present invention has the effect that the wafer can be well divided without the occurrence of cracking or chipping in the chip obtained by dividing the wafer. In particular, the present invention is useful for a wafer processing method of dividing a semiconductor wafer or an optical device wafer into the individual chips.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of processing a wafer having a plurality of first streets and a plurality of second streets formed on a front side of said wafer, said first streets extending in a predetermined direction and intersecting said second streets to partition a plurality of regions where a plurality of devices are respectively formed, said wafer processing method comprising:
    an expand tape attaching step of attaching an expand tape to the front side of said wafer;
    a first modified layer forming step of setting the focal point of a laser beam having a transmission wavelength to said wafer at a first height from the front side of said wafer after performing said expand tape attaching step and applying said laser beam from a back side of said wafer along said first streets and said second streets to thereby form first modified layers inside said wafer at said first height;
    a second modified layer forming step of setting the focal point of said laser beam at a second height different from said first height from the front side of said wafer before or after performing said first modified layer forming step and applying said laser beam from the back side of said wafer to only each intersection of said first streets and said second streets to thereby form second modified layers at said second height of each intersection;
    a third modified layer step of setting the focal point of said laser beam at a third height different from the first height and said second height from the front side of said wafer before or after performing said first modifying layer forming step and said second modified layer forming step, and applying said laser beam from the back side of said wafer so as to extend along said first streets and said second streets to thereby form third modified layers inside said wafer at said third height, and
    a dividing step of applying an external force to said wafer after performing said first and second modified layer forming steps to thereby divide said wafer into individual device chips along said first streets and said second streets with said first and second modified layers functioning as division start points;
    said second height being set at any position other than the positions corresponding to corner edge positions where cracks start to be generated on the corner edges of each device chip obtained by performing said dividing step,
    said third height being set at positions corresponding to the corner edge positions where cracks start to be generated on the corner edges of each device chip obtained by performing said dividing step.

2. The wafer processing method according to claim 1, wherein said first modified layer forming step includes the step of stopping the application of said laser beam at each intersection of said first streets and said second streets in applying said laser beam along either said first streets or said second streets or along both said first streets and said second streets.

3. A wafer processing method of processing a wafer having a plurality of first streets and a plurality of second streets formed on a front side of said wafer, said first streets extending in a predetermined direction and intersecting said second streets to partition a plurality of regions where a plurality of devices are respectively formed, said wafer processing method comprising:
    an expand tape attaching step of attaching an expand tape to the front side of said wafer;
    a first modified layer forming step of setting the focal point of a laser beam having a transmission wavelength to said wafer at a first height from the front side of said wafer after performing said expand tape attaching step and applying said laser beam from a back side of said wafer along said first streets and said second streets to thereby continuously form first modified layers inside said wafer at said first height;
    a second modified layer forming step of setting the focal point of said laser beam at a second height different from said first height from the front side of said wafer before or after performing said first modified layer forming step and applying said laser beam from the back side of said wafer along said first streets and said second streets to thereby form second modified layers at said second height inside said wafer;
    a third modified layer step of setting the focal point of said laser beam at a third height different from the first height and said second height from the front side of said wafer before or after performing said first modifying layer forming step and said second modified layer forming step, and applying said laser beam from the back side of said wafer so as to extend along said first streets and said second streets to thereby form third modified layers inside said wafer at said third height, and
    a dividing step of applying an external force to said wafer after performing said first and second modified layer forming steps to thereby divide said wafer into individual device chips along said first streets and said second streets with said first and second modified layers functioning as division start points;
    said second height corresponding to corner edge positions where cracks start to be generated on the corner edges of each device chip obtained by performing said dividing step;
    said third height being set at positions corresponding to the corner edge positions where cracks start to be generated on the corner edges of each device chip obtained by performing said dividing step,
    said second modified layer forming step including the step of stopping the application of said laser beam at each intersection of said first streets and said second streets in applying said laser beam along either said first streets or said second streets or along both said first streets and said second streets.

* * * * *